United States Patent
Guilloteau et al.

(10) Patent No.: US 7,248,070 B1
(45) Date of Patent: Jul. 24, 2007

(54) METHOD AND SYSTEM FOR USING BOUNDARY SCAN IN A PROGRAMMABLE LOGIC DEVICE

(75) Inventors: Patrick Guilloteau, Palaiseau (FR); Rafael C. Camarota, Sunnyvale, CA (US); Arun Kumar Varadarajan Rajagopal, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 170 days.

(21) Appl. No.: 11/059,929

(22) Filed: Feb. 16, 2005

(51) Int. Cl.
*H03K 19/173* (2006.01)
(52) U.S. Cl. ......................... 326/38; 714/726
(58) Field of Classification Search ............ 326/37–41; 714/724–727
See application file for complete search history.

(56) References Cited

U.S. PATENT DOCUMENTS 6,184,708 B1 * 2/2001 Jenkins, IV .................. 326/39
6,237,054 B1 * 5/2001 Freitag, Jr. .................... 710/72
6,247,147 B1 6/2001 Beenstra et al.
6,286,114 B1 9/2001 Veenstra et al.
6,594,802 B1 7/2003 Ricchetti et al.
6,774,672 B1 * 8/2004 Lien et al. ..................... 326/47
6,948,147 B1 * 9/2005 New et al. ..................... 716/16
2002/0069386 A1 * 6/2002 Neeb ........................... 714/733

OTHER PUBLICATIONS

"Virtex-4 Configuration Guide," Xilinx, UG071 (v1.1) Sep. 10, 2004, pp. 1-108.

* cited by examiner

*Primary Examiner*—Don Le

(57) ABSTRACT

A programmable logic device for transferring JTAG scan data to a target device is disclosed. The programmable logic device includes a JTAG logic that communicates with a JTAG scan chain and interprets user-defined instructions received from the JTAG scan chain to generate control signals used by a target device interface and the target device interface, which transmits output data to a target device and receives input data from the target device in response to the control signals.

20 Claims, 9 Drawing Sheets

METHOD AND SYSTEM FOR USING BOUNDARY SCAN IN A PROGRAMMABLE LOGIC DEVICE

FIELD OF THE INVENTION

The present invention relates to the field of programmable logic devices. In particular, the present invention relates to a method and system for using boundary scan in a programmable logic device.

BACKGROUND OF THE INVENTION

In recent years, increasing numbers of electronic products use flash memory devices for data storage. These flash memory devices store configuration data, operating system programs, multi-media data, etc. These flash memory devices need to be configured or programmed before they can be used in an electronic product. One of the issues in manufacturing is the programming of the flash memory devices, because of time utilized in programming the large amount of data to be stored in the flash memory devices. This issue becomes worse as the storage density of the flash memory devices increases in each newer generation.

To program the flash memory devices, a manufacturer has three options. The first option is to pre-program the flash memory devices before inserting them into a printed circuit (PC) board. However, this approach increases the cost of manufacturing because it requires extra fixtures to program the flash memory devices, and the flash memory devices once programmed cannot be used for other purposes.

The second option is to program the flash memory devices after they have been installed on the PC board. One way to accomplish such an in-system programming (ISP) is to first install a small program into a microprocessor, and then have the microprocessor program the flash memory device from an external data source, such as a manufacturing test system. A detailed description of ISP is found in "IEEE Standard for In-System Configuration of Programmable Devices," (a.k.a. IEEE Standard 1532-2002) published by *Test Technical Council of the IEEE Computer Society* on Dec. 11, 2002. However, this method also requires extra manufacturing fixtures and the data transfer to the flash memory device is inefficient.

A third way of performing in-system programming is to use Joint Test Action Group (JTAG) scan chain to control the pins which are connected to the flash memory. A detailed description of the JTAG test methodology is found in "IEEE Standard Test Access Port and Boundary-Scan Architecture," (a.k.a. IEEE Standard 1149.1-2001) published by *Test Technology Standards committee of the IEEE Computer Society* on Jun. 14, 2001. FIG. 1 illustrates an existing method for programming a flash memory device by using a JTAG scan chain. As shown in FIG. 1, a PC board 100 includes a programmable logic device ("PLD") 102. The PLD 102 works with many devices on the PC board, for example, a microprocessor 104, an application specific integrated circuit (ASIC) 106, a FPGA 108, display LEDs 110, a static random access memory (SRAM) 112, a system bus 114, a JTAG scan chain 116, a JTAG boundary scan chain 117, which bounds the PLD 102, and a flash memory device 118.

In many applications, the JTAG boundary scan chain 117 may contain hundreds of pins. However, only a small fraction of these pins connect the PLD 102 to the flash memory 118, as shown by the shaded area 120. This method requires shifting hundreds of bits of data through the entire JTAG boundary scan chain 117 in order to write a few bits of data to the flash memory device 118. Thus, the existing method of using the JTAG boundary scan chain 117 for programming the flash memory device 118 is inefficient.

Additionally, writing bits of data to the flash memory device 118 (i.e., programming the device) through the JTAG boundary scan chain 117 requires the PLD 102 to enter a programming mode, which results in the core of the PLD 102 and other devices connected to the PLD 102 to temporarily cease functioning.

Therefore, there is a need for a method and system that can use JTAG to access a target device through a PLD.

SUMMARY

The disclosed embodiments of the invention solve the problem of programming a target device using the JTAG boundary scan chain connections that are already present on the PC board during the manufacturing process. The disclosed embodiments of the invention are consistent with JTAG testing and PLD programming, as PLDs use the JTAG scan chain as the programming port. The disclosed embodiments of the invention connect the control signals of the JTAG logic to the programmable logic array ("PLA") of the PLD. It utilizes the flexibility of the PLD to connect to any type of target device. The disclosed embodiments of the invention enable the PLD to efficiently retrieve data from the JTAG scan chain to generate formatted data that matches the receiving target device. It then sends the formatted data directly to the target device without traversing all the pins of the JTAG boundary scan chain.

BRIEF DESCRIPTION OF THE DRAWINGS

The aforementioned features and advantages of the invention as well as additional features and advantages thereof will be more clearly understood hereinafter as a result of detailed descriptions of embodiments of the invention when taken in conjunction with the following drawings.

Like numbers are used throughout the figures.

DESCRIPTION OF EMBODIMENTS

Methods and systems are provided for accessing a target device by using just a portion (e.g., a few pins) of the JTAG boundary scan chain of a PLD. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 1:
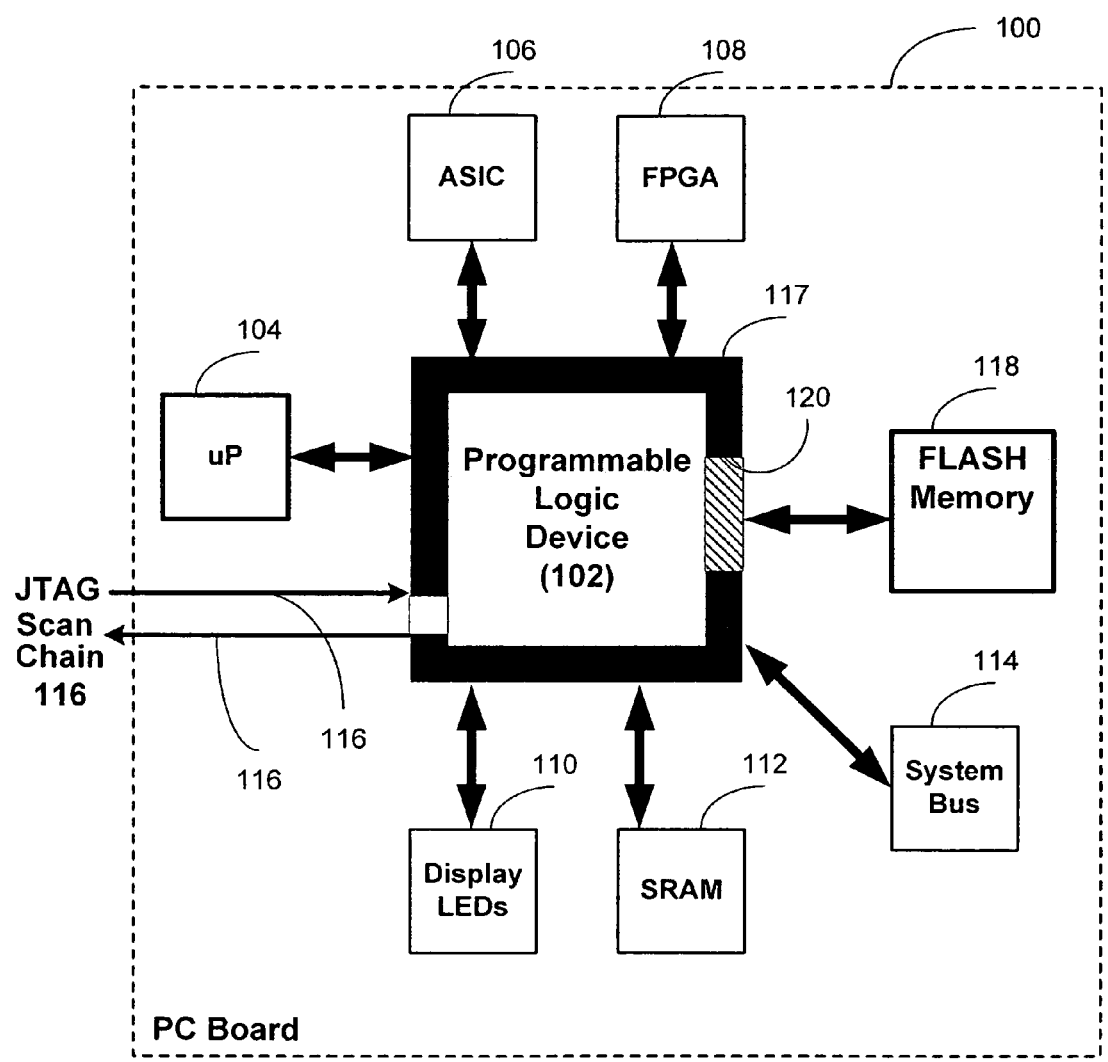
FIG. 1 illustrates an existing system for programming a flash memory device by using a JTAG scan chain.
Figure 2:
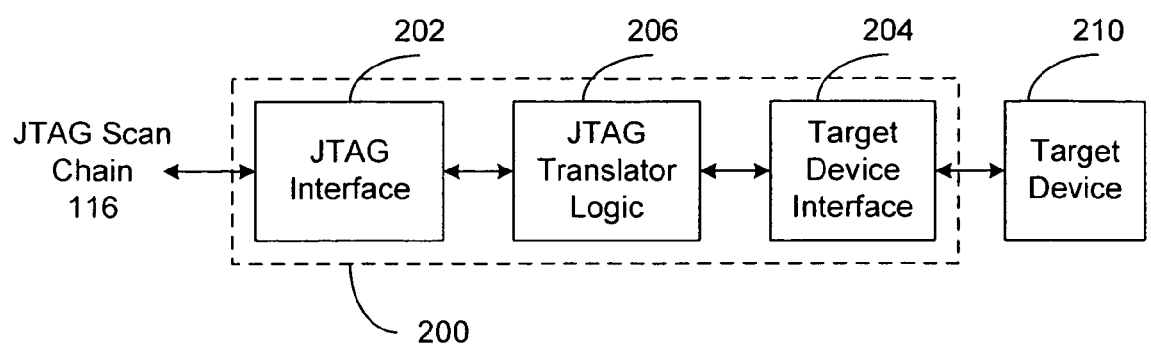
FIG. 2 illustrates the functional blocks of a PLD for accessing a target device by using JTAG boundary scan chain of the PLD according to an embodiment of the present invention.

FIG. 2 illustrates the functional blocks of a PLD for accessing a target device by using the JTAG boundary scan chain of the PLD according to an embodiment of the present invention. The PLD 200 includes a JTAG interface logic 202, a target device interface 204, and JTAG translator logic 206. The JTAG interface logic 202 communicates with JTAG I/O signals from the JTAG scan chain 116, while the target device interface 204 communicates with a target device 210. The JTAG translator logic 206 interprets user-defined instructions received from the JTAG interface logic 202. Based on the user-defined instructions, the JTAG translator logic creates signals available for the target device interface 204 to support data transfer between the JTAG interface logic 202 and the target device 210.

Figure 3:
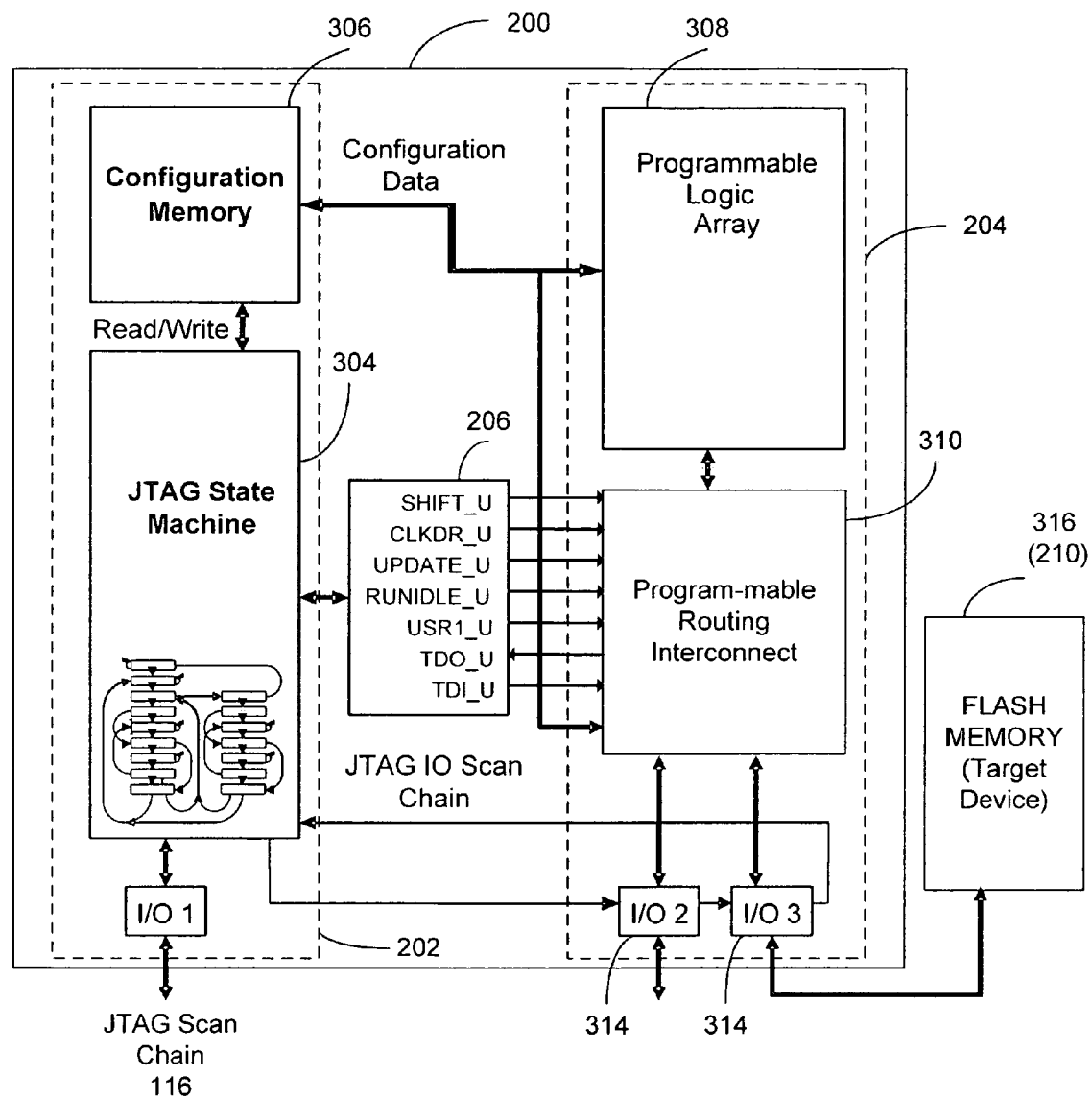
FIG. 3 illustrates an implementation of a PLD for bridging between a JTAG scan chain and a flash memory device according to an embodiment of the present invention.

FIG. 3 illustrates an implementation of a PLD for bridging between a JTAG scan chain and a flash memory device according to an embodiment of the present invention. The PLD 200 includes a JTAG interface logic 202, a flash memory (target device) interface 204, and a JTAG translator logic 206. The JTAG interface logic 202 includes bi-directional input/output (I/O) devices 302, a JTAG state machine 304, and a configuration memory 306. The flash memory interface 204 includes a PLA 308, a programmable routing interconnect 310, and one or more bi-directional I/O devices 314. The flash memory interface 204 is coupled to an external flash memory (target) device 316 (210).

Figure 6:
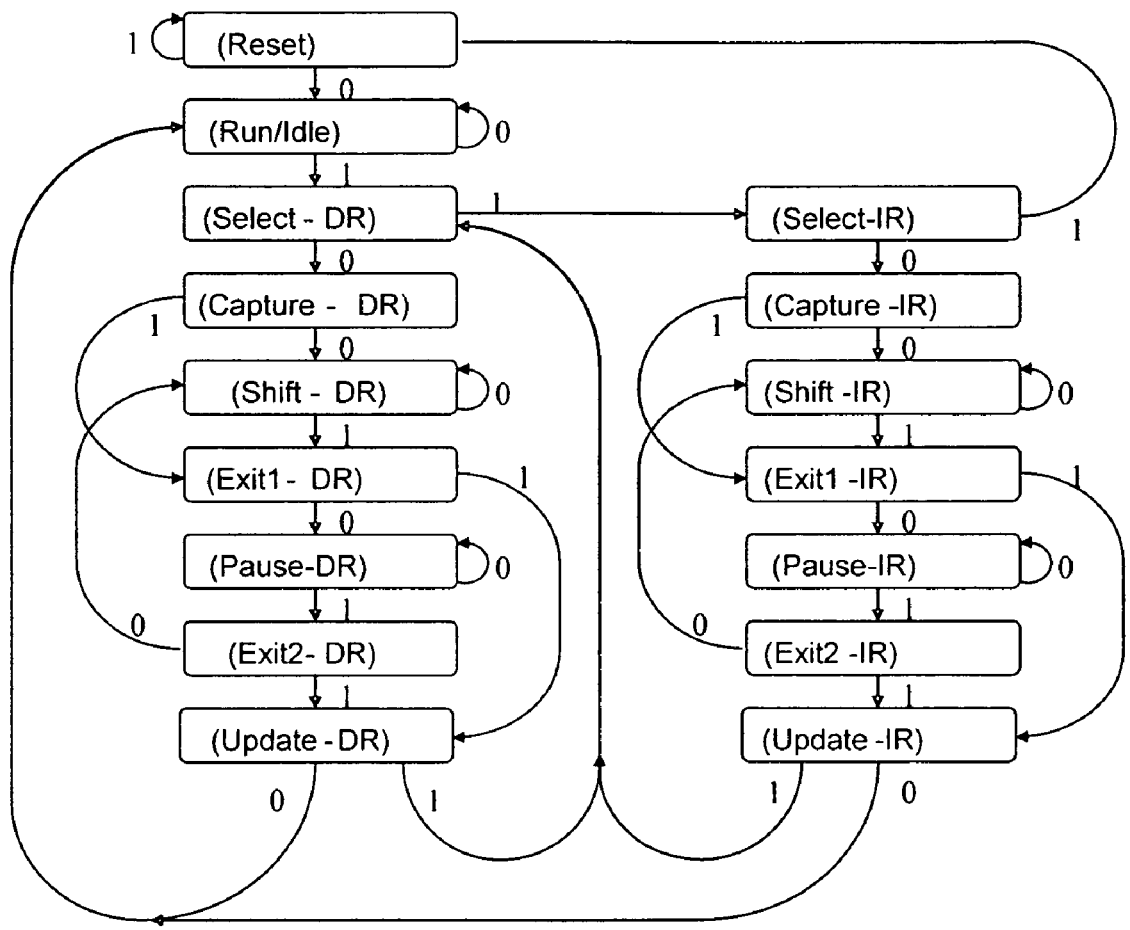
FIG. 6 illustrates an example of a JTAG state machine.

The JTAG state machine 304 is controlled by the JTAG signals TCK, TDO, TDI, and TMS, which are received through the JTAG scan chain 116. An example of the JTAG state machine 304 is shown in FIG. 6. In this example, the state of the JTAG state machine 304 is controlled by the TMS JTAG signal. In other words, the JTAG TMS signal is the state transition bit. Further, this and one or more of the other JTAG signals determine the content of a JTAG instruction register (and other registers such as a boundary scan register, a bypass register, and an ID register) (not shown) located in the JTAG state machine 304.

The JTAG translator logic 306 generates a set of JTAG data and control signals, which are listed in Table 1. These data and control signals are active when a user defined instruction, such as a flash instruction, is active in the JTAG instruction register.

TABLE 1

| SIGNAL NAME | DESCRIPTION |
| --- | --- |
| SHIFT_U | Control signal to the target device interface. Indicates that the JTAG translator logic is in the Shift-DR state or the Capture-DR state. |

TABLE 1-continued

| SIGNAL NAME | DESCRIPTION |
| --- | --- |
| CLKDR_U | Clock signal to the target device interface that is derived from the TCK pin. Active only when JTAG translator logic is in Capture-DR and Shift-DR states and a user instruction is in the JTAG instruction register. |
| UPDATE_U | Control signal to the target device interface that indicates that the JTAG translator logic is in the Update-DR state. |
| RUNIDLE_U | Control signal to the target device interface that indicates the JTAG translator logic is in the Run/Idle state and that a user instruction is in the JTAG instruction register. |
| USR1_U | Control signal to the target device interface. This signal is '1' if User Scan Register1 ("USR1") instruction is loaded into JTAG instruction register and '0' if USR0 instruction is loaded into the JTAG instruction register. |
| TDO_U | Output of the JTAG boundary scan chain that is multiplexed with JTAG TDO output to drive the TDO pin. |
| TDI_U | Buffered version of the TDI pin, which is input to the USR0 and USR1 scan registers for the target device interface. |

Figure 5:
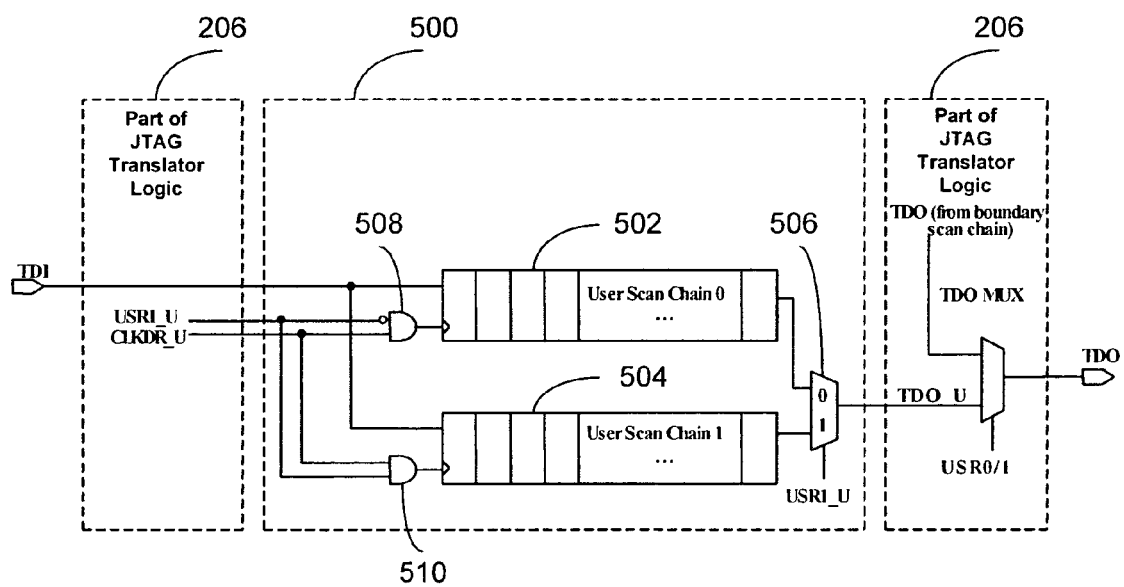
FIG. 5 illustrates an implementation of shift and capture registers according to an embodiment of the present invention.

Note that some of the signals shown in Table 1 are multiplexed in order to reduce the number of signal lines. For instance, there is no USR0_U signal. The "_U" signals are only active for USR1 and USR0 commands. Thus, CLKDR_U is active for only USR0 and USR1 commands. Combining ("ANDing") USR1_U with a _U signal generates a respective signal for the two shift registers as shown in FIG. 5. Also, note that there is no CAPTURE_U signal. CAPTURE_U is implied when UPDATE_U=0, SHIFT_U=0, and CLKDR_U=1. In another implementation, the USRx_U may be a multiple-bit (n) bus allowing for implementation of $2^n$ possible user-defined instructions and/or shift registers.

The data and control signals of the JTAG translator logic 206 are connected to the programmable routing interconnect 310, which may be implemented with input/output (I/O) select multiplexers. Additionally, the JTAG state machine 304 performs write/read operations to configure or verify the configuration memory 306. The configuration memory 306 provides configuration data that controls the operation of the PLA 308 and the programmable routing interconnect 310. Based on the configuration data received from the configuration memory, the signals from the JTAG translator logic 206 may be transferred to the PLA 308 or to the external target device. The PLA 308 is coupled to the I/O buffers, I/O 2 and I/O 3, through the programmable routing interconnect 310 and these I/O buffers are connected to target devices. These I/O buffers preferably are one or more pins of the JTAG boundary scan chain 117.

The PLA implements the flash memory interface logic that drives the flash memory interface. During programming of a flash memory device, the JTAG translator logic interprets user-defined instructions (received from the JTAG interface logic) for transferring data from the TDI signal of the JTAG scan chain 116 to the flash memory 316 (target device 210). The flash memory interface can be programmed to work with different devices, such as different flash memory standards. A person of ordinary skill in the art would recognize that the PLA used to implement part of the target device interface can be first arranged for programming the flash memory during manufacturing, and then it can be overwritten with another application, or be used as a part of the programmable logic application after the PC board is manufactured.

Figure 4:
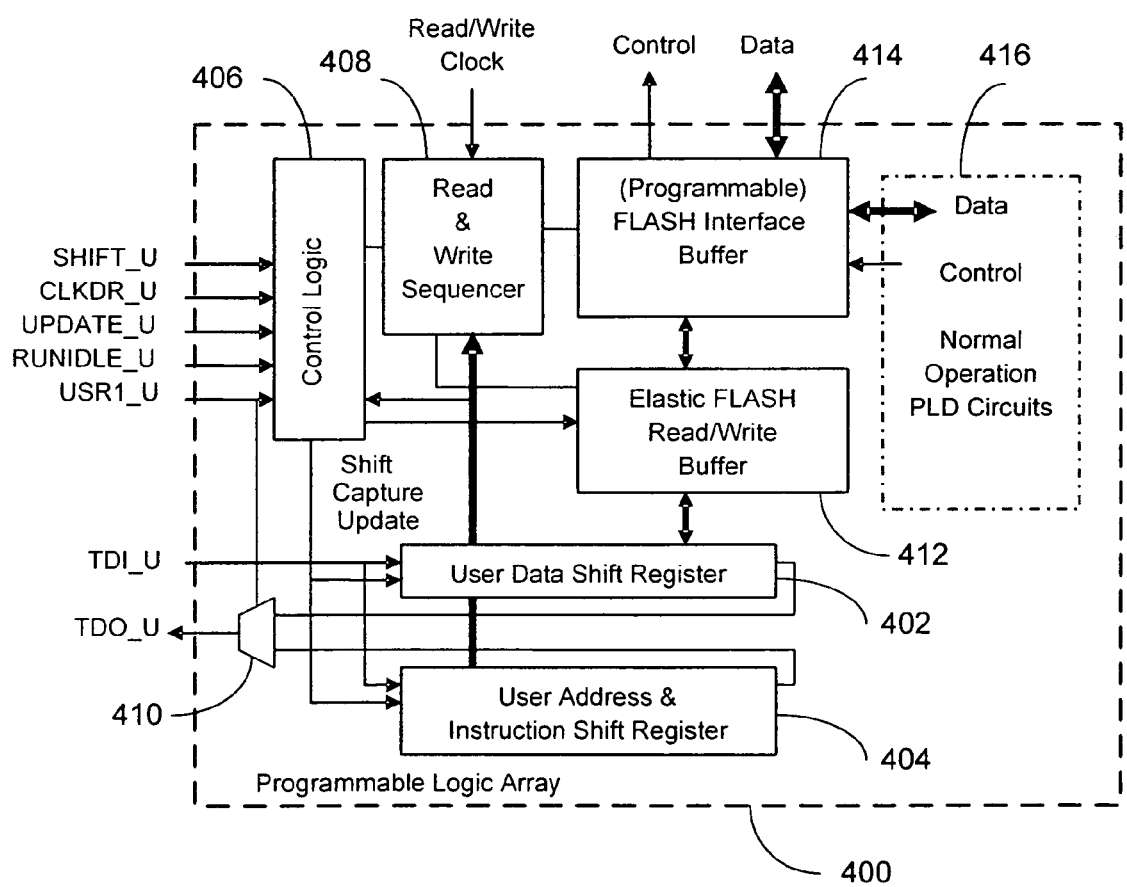
FIG. 4 illustrates an implementation of the PLA of FIG. 3 according to an embodiment of the present invention.

FIG. 4 illustrates an implementation of the PLA of FIG. 3 according to an embodiment of the present invention. The PLA 400 includes a user data shift register 402, a user address & instruction shift register 404, a control logic 406, a read & write sequencer 408, a scan data-out multiplexer 410, an elastic flash read/write buffer 412 and a programmable flash interface buffer 414.

The user data shift register 402 and user address & instruction shift register 404 are enabled by USR0 and USR1, respectively. The user data shift register 402 loads data that is written to or read from the flash memory. The user address & instruction shift register 404 is used to load flash address values for read and write, and is used to implement commands that control the operation of the control logic 406 and the read & write sequencer 408. Both shift registers are connected to TDO_U (see Table 1) through the scan data-out multiplexer 410, which is controlled by USR1_U. The elastic flash read/write buffer 412 is used in the serial to parallel and parallel to serial data conversion. The elastic flash read/write buffer 412 is further used to synchronize data transfer between the TCK signal from the JTAG scan chain 116 and the flash read/write clock, which may have different frequencies or may be asynchronous to each other. The elastic flash read/write buffer 412 delivers data from the JTAG scan chain 116 to the flash port at the maximum rate supported by the flash port, and in the format, either parallel or serial, required by the flash port.

The programmable flash interface buffer 414 generates the I/O signals as required by the external flash memory. The programmable flash interface buffer 414 may also perform parallel to serial conversion of data if required by the external flash memory. The programmable flash interface buffer also multiplexes the flash data I/O between the data source coming from the elastic flash read/write buffer 412 and the address coming from the read & write sequencer 408. The read & write sequencer 408 generates patterns on the external flash I/O consistent with the external flash memory requirements, supporting read or write operations from the flash memory device. The read & write sequencer 408 also tracks the flash memory address value and contains a counter for incrementing the address automatically when necessary. This increases the programming efficiency because address values are not required to be transferred through the JTAG scan chain 116 along with the data. One address is needed for a large partition of data to be programmed into the flash memory.

The control logic 406 is enabled when USR1 and USR0 commands are in the JTAG instruction register. It controls the transfer of data from the user data shift register 402 to and from the elastic flash read/write buffer 412. It also controls the transfer of data between the user address & instruction shift register 404 and the read & write sequencer 408. It further controls the multiplexing of the external flash pins between flash control logic and normal circuit operation.

The programmable flash interface buffer 414 communicates with the normal operation PLD circuits 416 (shown in dotted line) via a set of data and control signals. Additionally, the PLA 308 communicates with the JTAG translator logic 206 and the target device (210) via the programmable routing interconnect 310, but this is not shown in FIG. 4.

FIG. 5 is a simplified illustration of shift and capture registers according to an embodiment of the present invention. The shift and capture registers 500 can be used to implement the user data shift register or the user address & instruction shift register of FIG. 4. The shift and capture registers include a first variable-length shift register 502 for storing data from user scan chain 0, a second variable-length shift register 504 for storing data from user scan chain 1, and a multiplexer 506 for directing the output of the first variable-length shift register 502 and the second variable-length shift register 504 to the scan data-out TDO_U of the JTAG translator logic. Each of the first and second variable-length shift registers may be able to receive serial data through a serial shift input (TDI) or capture parallel input data. Each of the first and second variable-length shift registers may also be able to output serial data through a serial shift output (TDO) or transmit parallel output data.

The shift and capture registers 502 and 504 further include shift enable logics 508 and 510 for the first and second variable-length shift registers respectively. The shift enable logics 508 and 510 are driven by control signals USR1_U and CLKDR_U of the JTAG translator logic 206. Similarly, the output of the multiplexer 506 is controlled by the control signal USR1_U of the JTAG translator logic 206. Note that the USR1_U is a 1 bit signal that controls two user scan register's CLKDR_U in this example. In other implementations, the USR1_U may be an n-bit signal, which may be used to control $2^n$ user scan registers. Similarly, other control signals of Table 1, such as Update_U and Shift_U, may be multiplexed to increase the number of supported user scan registers accordingly.

In one embodiment, the target device interface 204 of FIG. 2 can be used to implement a power-on reset (POR) status register. POR is a common function for PLDs, whether for controlling and monitoring power supplies, configuring FPGAs, or sequentially enabling processors and ASICs. This application combines POR status debug and manufacturing analysis into the in-system programming (ISP) JTAG scan chain, reducing an additional special purpose debug/manufacturing connection. The target device interface 204 is used to implement a status register that communicates between the user and the POR state machine via the JTAG scan chain. The status register may contain information such as which devices are powered up, when the system is powered up (time & date), or any errors that are generated in the process. It also uses the status register to hold user programmed break-points for the POR state machine in performing system debug.

Figure 7:
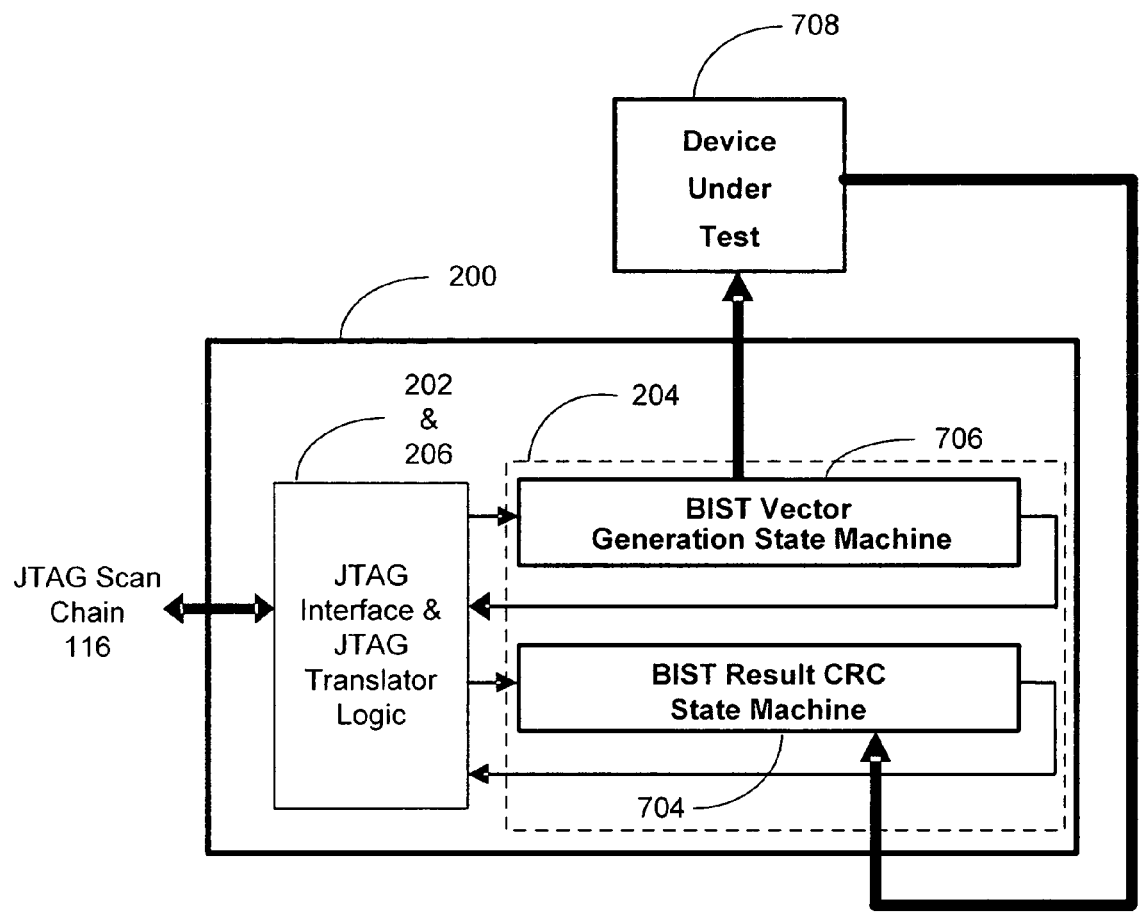
FIG. 7 illustrates an implementation of a Built-In-Self-Test in a PLD according to an embodiment of the present invention.

In a different embodiment, the target device interface 204 can be used to implement a Built-In-Self-Test (BIST) state machine. BIST is a popular way to efficiently test components on a PC board because it saves the cost of having expensive test equipment for testing different aspects of the PC board. FIG. 7 illustrates an implementation of a Built-In-Self-Test in a PLD according to an embodiment of the present invention. The PLD 200 includes a JTAG interface logic 202, a target device (device under test) interface 204, and a JTAG translator logic 206 (shown together with JTAG interface logic 202). The target device interface 204 implements a BIST result cyclic-redundancy-check (CRC) state machine 704 and a BIST vector generation state machine 706. The outputs of the BIST Vector Generation State Machine 706 drive a device-under-test 708. The BIST result CRC state machine 704 receives inputs from the targeted device-under-test 708. The BIST vector generation state machine 706 is a random or pseudo-random state machine that generates vectors for a system under test. The BIST result (CRC) state machine 704 is used to sample result vectors and generate a unique result if the test vectors are valid. In such an approach, a user scan chain 0 register may be used as a vector generation state machine seed, and the user scan chain 1 may be used as the CRC register. One advantage of using the target device interface 204 to implement BIST is that it is cheaper and faster to build BIST engines for testing sub-systems like memory, HSSI, USB, PCI, etc. Another advantage is that BIST can be used to conduct field diagnostics for monitoring system fitness.

In another embodiment, the target device interface 204 can be used to access data from a system event log. During system debug or when a new system is being tuned for performance, it is helpful to count or log certain events. The programmability and fast performance of a PLD makes it ideal for decoding complex events. The PLD logs the event count and other details in registers that are accessible through the JTAG scan chain 116 using the JTAG interface logic and JTAG translator logic.

Figure 8:
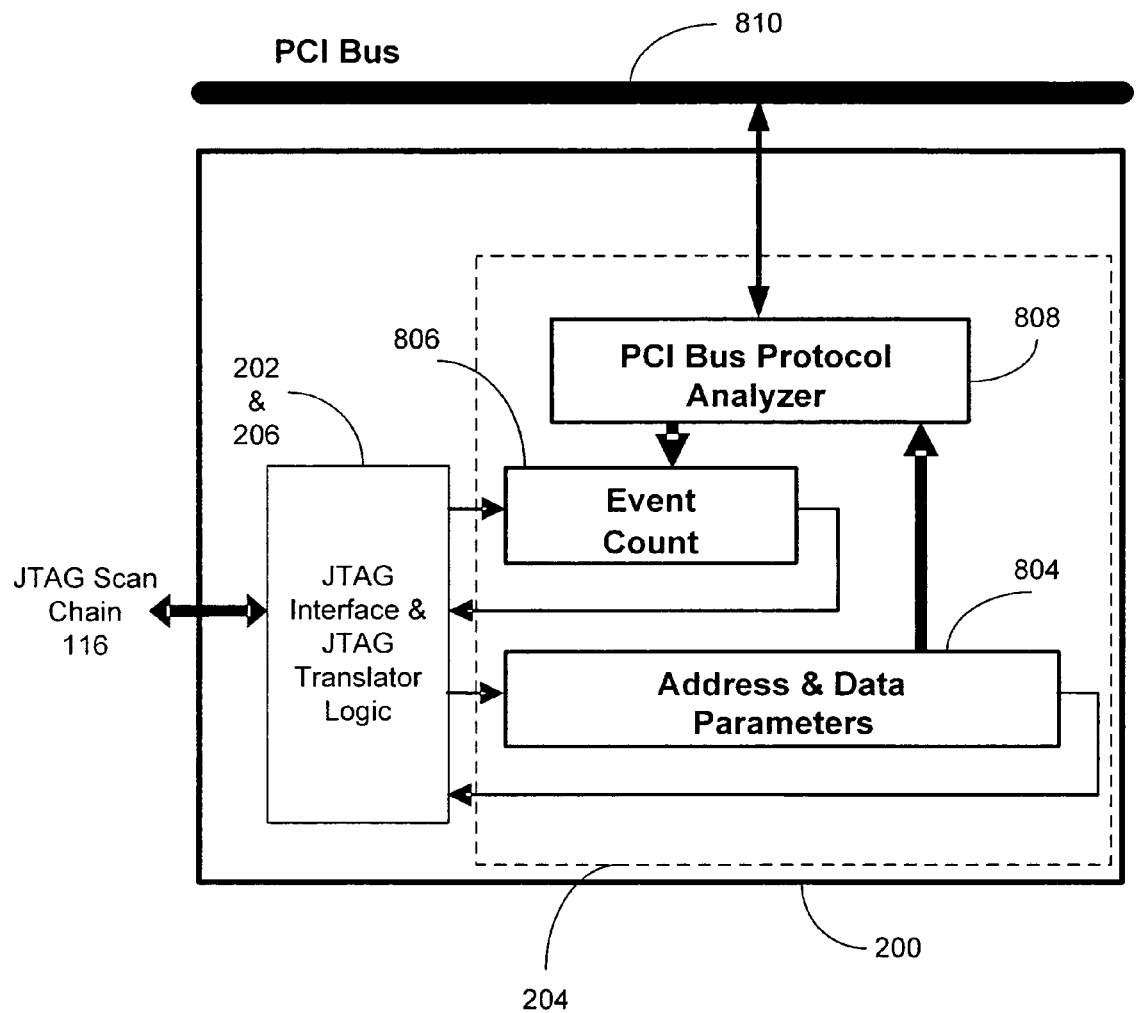
FIG. 8 illustrates an implementation of a PCI bus protocol analyzer design in a PLD according to an embodiment of the present invention.

For example, the target device interface 204 may be used to monitor a PCI bus. It counts how often a certain address is accessed for Read or Write. This function is called "sniffing the bus." FIG. 8 illustrates an implementation of a PCI bus protocol analyzer design in a PLD according to an embodiment of the present invention. The PLD 200 includes a JTAG interface logic 202, a target device (PCI Bus) interface 204, and a JTAG translator logic 206 (shown together with JTAG interface logic 202). The target device interface 204 implements an Address & Data Parameter register 804, an Event Count register 806, and a PCI bus protocol analyzer 808. The PCI bus protocol analyzer monitors activities on the PCI bus 810, based on the parameters in the Address & Data Parameter register 804, and logs matching events in the Event Count register 806.

In yet another embodiment, the target device interface can be used to implement a bridge from the JTAG scan chain 116 to any serial or parallel interface. This bridge allows tester to use a common protocol, such as JTAG, and allows ASICs, ASSPs and other peripheral devices to use different protocols. Some examples of peripheral device protocols to bridge to may include: MIDI, SPI, I²C, PCI, SMBus, and CAN buses.

Figure 9:
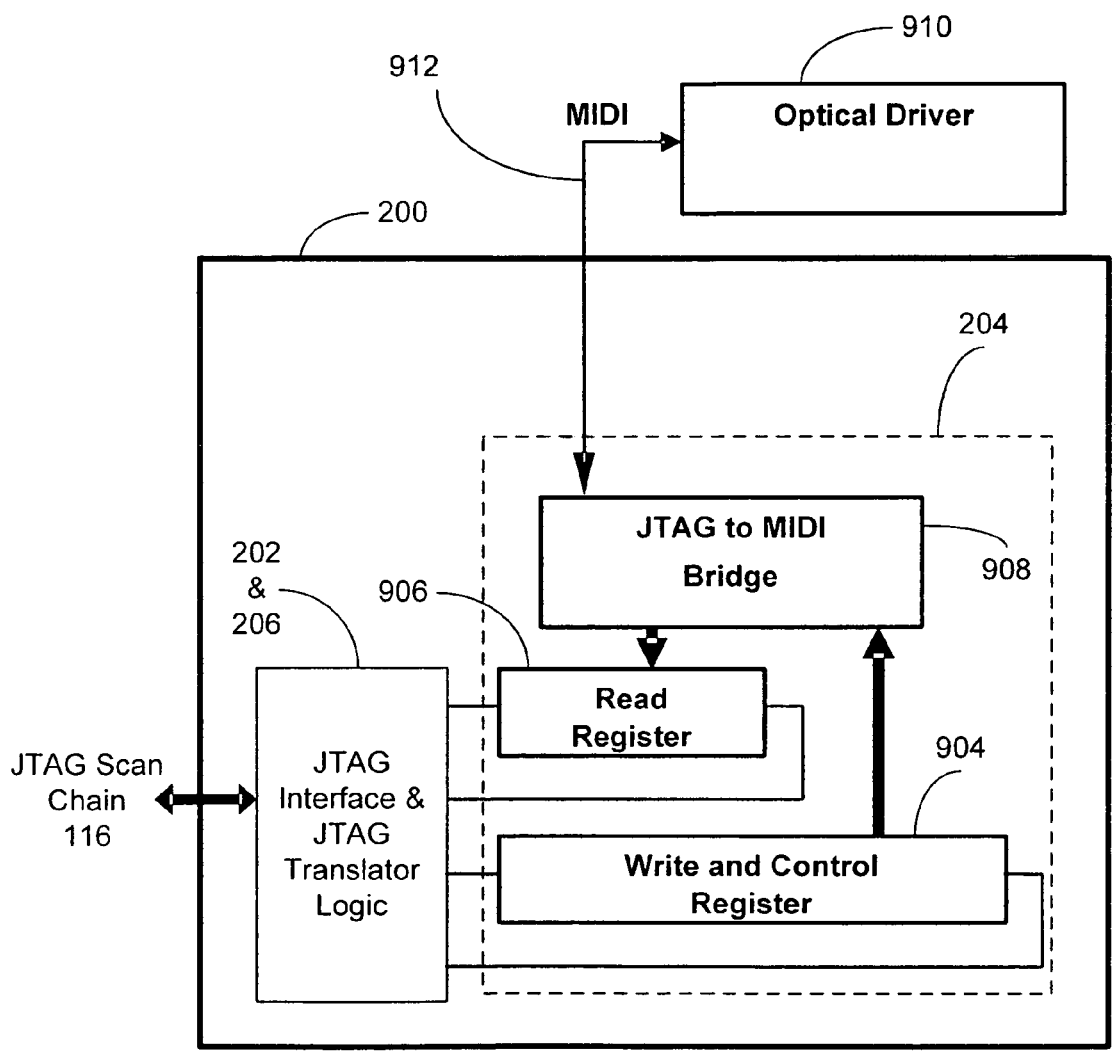
FIG. 9 illustrates an implementation of a JTAG to MIDI Bridge according to an embodiment of the present invention.

For example, during system testing, this application can be used to test various system busses by using the JTAG scan chain. It can also be used to configure certain parts of the system using the JTAG scan chain. FIG. 9 illustrates an implementation of a JTAG to MIDI Bridge according to an embodiment of the present invention. The PLD 200 includes a JTAG interface logic 202, a target device (MIDI) interface 204, and a JTAG translator logic 206 (shown together with the JTAG interface logic 202). The target device interface 204 implements a Write & Control Register 904, a Read Register 906, and a JTAG to MIDI Bridge 908. The JTAG to MIDI Bridge 908 communicates with an external optical driver 910 through a MIDI bus 912. This figure shows a method to format data from the JTAG scan chain 116 for the optical driver (target device) 910 connected through a MIDI bus.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated. For example, JTAG translator logic 206 and JTAG interface logic 202 may be combined to form JTAG logic without departing from the invention.

What is claimed is:

1. A programmable logic device, comprising:
   a JTAG scan chain interface;
   a JTAG boundary scan chain bounding the programmable logic device;
   JTAG logic, wherein the JTAG logic generates signals based on input data received from the JTAG scan chain interface; and
   a target device interface, wherein the target device interface transmits output data to a target device through just a portion of the JTAG boundary scan chain in response to the signals, wherein the target device is external to the programmable logic device.

2. The programmable logic device of claim 1, wherein the JTAG logic comprises JTAG interface logic and JTAG translator logic, wherein the input data includes an instruction related to the JTAG boundary scan chain and an instruction related to the target device interface and wherein the JTAG interface logic interprets the instruction related to the JTAG boundary scan chain and the JTAG translator interprets the instruction related to the target device interface.

3. The programmable logic device of claim 2, wherein the JTAG interface logic includes:
   an input/output device coupled to the JTAG scan chain interface to receive the input data; and
   a JTAG state machine, which uses an instruction register to make the instruction related to the target device interface available to the JTAG translator logic.

4. The programmable logic device of claim 1, wherein the target device interface comprises:
   an input/output device;
   a programmable routing interconnect; and
   a programmable logic array.

5. The programmable logic device of claim 4, wherein the input/output device comprises one or more pins that form the portion of the JTAG boundary scan chain.

6. The programmable logic device of claim 1, wherein the target device interface includes one or more shift registers providing a parallel interface to the target device and a serial interface to the JTAG logic.

7. The programmable logic device of claim 1, wherein the target device interface implements:
   a built-in-self-test (BIST) vector generation state machine; and
   a BIST result cyclic redundancy check (CRC) state machine.

8. The programmable logic device of claim 1, wherein the target device interface implements:
   a PCI bus protocol analyzer;
   a PCI bus event counter; and
   an address and data parameter register.

9. The programmable logic device of claim 1, wherein the target device interface implements:
   a JTAG to peripheral bus bridge;
   read registers;
   write registers; and
   control registers.

10. The programmable logic device of claim 1, wherein the signals comprise clock, data, and control signals common to a plurality of registers in the target device interface and a signal to select one of the plurality of registers to process the clock, data, and control signals.

11. The programmable logic device of claim 1, wherein the signals comprise a set of clock, data, and control signals for each of a plurality of registers in the target device interface.

12. The programmable logic device of claim 1, wherein the target device interface receives output data from the target device through just the portion of the JTAG boundary scan chain and transmits the output data to the JTAG logic, which transmits the output data to the JTAG scan chain.

13. A method for transferring JTAG scan chain data to a target device through a programmable logic device, comprising:
receiving at the programmable logic device input data from a JTAG scan chain;
generating with the programmable logic device data for the target device based on the input data; and
using just a portion of a JTAG boundary scan chain bounding the programmable logic device to transmit the data to the target device, wherein the target device is external to the programmable logic device.

14. The method of claim 13, further comprising using just the portion of the JTAG boundary scan chain to transmit output data from the target device to the JTAG scan chain through the programmable logic device.

15. A system for programming a target device, the system comprising:
a JTAG scan chain; and
a programmable logic device bounded by a JTAG boundary scan chain, the programmable logic device connected to a target device through one or more pins that form a portion of the JTAG boundary scan chain, wherein the target device is external to the programmable logic device;
wherein the programmable logic device programs the target device through just the one or more pins pursuant to input data received from the JTAG scan chain.

16. The system of claim 15, wherein the programmable logic device includes JTAG logic and a programmable logic array fabric.

17. The system of claim 16, wherein the programmable logic device includes:
an input/output device;
a programmable routing interconnect; and
a programmable logic array.

18. The system of claim 17, wherein the input/output device comprises just the one or more pins.

19. The system of claim 15, wherein the programmable logic device includes one or more shift registers providing a parallel interface to the target device and a serial interface to the JTAG logic.

20. The system of claim 15, wherein the programmable logic device receives data from the target device through just the one or more pins and transmits output data to the JTAG scan chain in response to the data.

* * * * *